US 9,578,756 B2

(12) United States Patent
Nishioka et al.

(10) Patent No.: US 9,578,756 B2
(45) Date of Patent: *Feb. 21, 2017

(54) PRINTED WIRING BOARD AND METHOD FOR MANUFACTURING PRINTED WIRING BOARD

(71) Applicant: IBIDEN Co., Ltd., Ogaki-shi (JP)

(72) Inventors: Hiroyuki Nishioka, Ogaki (JP); Shinsuke Ishikawa, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/564,122

(22) Filed: Dec. 9, 2014

(65) Prior Publication Data

US 2015/0163900 A1    Jun. 11, 2015

(30) Foreign Application Priority Data

Dec. 9, 2013 (JP) .................................. 2013-253836

(51) Int. Cl.
*H05K 1/09* (2006.01)
*C08F 2/46* (2006.01)
(Continued)

(52) U.S. Cl.
CPC ........... *H05K 3/4644* (2013.01); *H01L 21/486* (2013.01); *H01L 21/4857* (2013.01);
(Continued)

(58) Field of Classification Search
CPC .... H05K 1/0298; H05K 1/0346; H05K 1/115; H05K 2201/0154; H05K 2201/0158; H05K 2203/095; H05K 3/4644; H01L 21/4857; H01L 21/486
See application file for complete search history.

(56) References Cited

U.S. PATENT DOCUMENTS 4,526,806 A * 7/1985 Haque et al. ............ B05D 1/62
427/255.6
7,033,648 B1 * 4/2006 Doany et al. ....... C23C 18/1605
427/125
(Continued)

FOREIGN PATENT DOCUMENTS

JP    2000-307225 A    11/2000
JP    2012-191204 A    10/2012
(Continued)

OTHER PUBLICATIONS

U.S. Appl. No. 14/564,126, filed Dec. 9, 2014, Nishioka, et al.

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A printed wiring board includes resin insulation layers, conductive layers formed on the resin insulation layers respectively such that each of the conductive layers is formed on a surface of each of the resin insulation layers, and via conductors penetrating through the resin insulation layers respectively such that the via conductors are connecting the conductive layers through the resin insulation layers. Each of the resin insulation layers includes a modified resin layer formed by plasma treatment such that the modified resin layer is forming the surface of each of the resin insulation layers, each of the conducive layers includes a modified conductive layer formed by the plasma treatment such that the modified conductive layer is forming the surface of each of the conductive layers, and the modified resin layer has a surface modification different from a surface modification of the modified conductive layer.

20 Claims, 6 Drawing Sheets

(51) Int. Cl.
  *C08J 7/18* (2006.01)
  *H05H 1/00* (2006.01)
  *H05H 1/24* (2006.01)
  *H05K 3/46* (2006.01)
  *H01L 23/538* (2006.01)
  *H01L 21/48* (2006.01)
  *H01L 23/498* (2006.01)

(52) U.S. Cl.
  CPC .. *H01L 23/49822* (2013.01); *H01L 23/49827* (2013.01); *H01L 23/5383* (2013.01); *H01L 23/49816* (2013.01); *H01L 2224/16225* (2013.01); *H01L 2224/81192* (2013.01); *H01L 2924/15311* (2013.01); *H05K 2203/095* (2013.01)

(56) References Cited

U.S. PATENT DOCUMENTS

| | | | | |
|---|---|---|---|---|
| 2002/0162687 | A1* | 11/2002 | Akihiko | H05K 3/389 174/262 |
| 2006/0118133 | A1* | 6/2006 | Suzuki et al. | B08B 7/0035 156/345.31 |
| 2009/0056994 | A1* | 3/2009 | Kuhr et al. | C23C 18/1653 174/259 |
| 2009/0078451 | A1* | 3/2009 | Niki et al. | H05K 3/4682 174/250 |
| 2011/0168430 | A1* | 7/2011 | Hata | H05K 3/389 174/126.1 |
| 2013/0299079 | A1* | 11/2013 | Manabe et al. | B32B 7/12 156/272.6 |
| 2015/0163901 | A1* | 6/2015 | Nishioka et al. | H01L 23/145 174/251 |

FOREIGN PATENT DOCUMENTS

KR 10-2008-0004107 A 1/2008
KR 10-2011-0022738 A 3/2011

* cited by examiner

FIG. 6(B)  N2+H2 Plasma

High-density NH+ Radical

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2013-253836, filed Dec. 9, 2013, the entire contents of which are incorporated herein by reference.

BACKGROUND OF THE INVENTION

Field of the Invention

The present invention relates to a printed wiring board formed by alternately laminating a conductive layer and a resin insulation layer, and to a method for manufacturing such a printed wiring board.

Description of Background Art

In JP2000-307225A, an insoluble type of resin containing soluble particles and insoluble particles is used to form an interlayer resin insulation layer, and the soluble particles exposed on a surface of the interlayer resin insulation layer are dissolved so as to form a roughened surface with concaves shaped therein. In addition, a roughened surface is formed on a conductive layer through oxidation-reduction treatment. The entire contents of this publication are incorporated herein by reference.

SUMMARY OF THE INVENTION

According to one aspect of the present invention, a printed wiring board includes resin insulation layers, conductive layers formed on the resin insulation layers respectively such that each of the conductive layers is formed on a surface of each of the resin insulation layers, and via conductors penetrating through the resin insulation layers respectively such that the via conductors are connecting the conductive layers through the resin insulation layers. Each of the resin insulation layers includes a modified resin layer formed by plasma treatment such that the modified resin layer is forming the surface of each of the resin insulation layers, each of the conducive layers includes a modified conductive layer formed by the plasma treatment such that the modified conductive layer is forming the surface of each of the conductive layers, and the modified resin layer has a surface modification different from a surface modification of the modified conductive layer.

According to another aspect of the present invention, a method for manufacturing a printed wiring board includes forming a conductive layer on a resin insulation layer, and applying microwave plasma treatment on the conductive layer and the resin insulation layer in a mixed gas atmosphere including a nitrogen gas and a hydrogen gas such that the resin insulation layer includes a modified resin layer forming the surface of the resin insulation layer and that the conducive layer includes a modified conductive layer forming the surface of the conductive layer and having a surface modification which is different from a surface modification of the modified resin layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6(A)-6(D) are views schematically showing plasma treatment.

DETAILED DESCRIPTION OF THE EMBODIMENTS

Figure 1A:
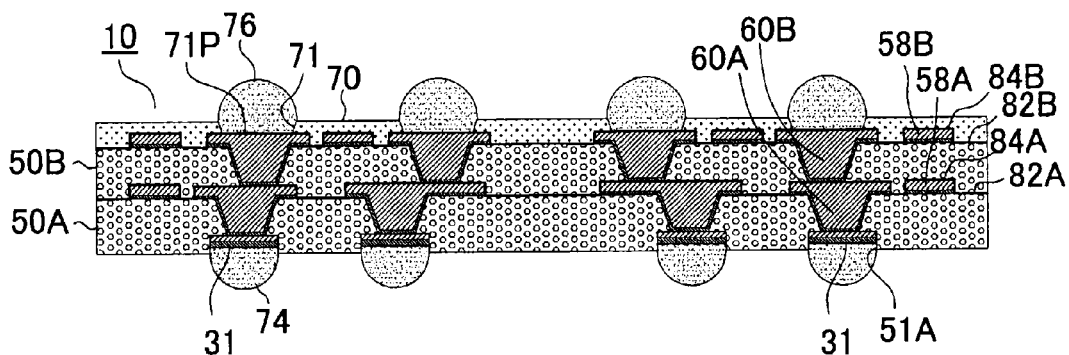
FIG. 1(A) is a cross-sectional view of a printed wiring board according to a first embodiment of the present invention.

The embodiments will now be described with reference to the accompanying drawings, wherein like reference numerals designate corresponding or identical elements throughout the various drawings.

Figure 1B:
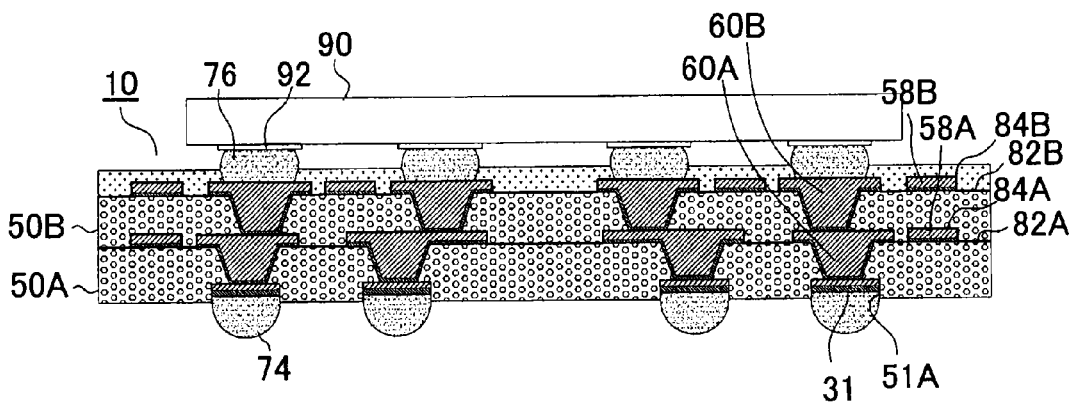
FIG. 1(B) is a cross-sectional view of an applied example where an IC chip is mounted on the printed wiring board in FIG. 1(A)
Figure 1C:
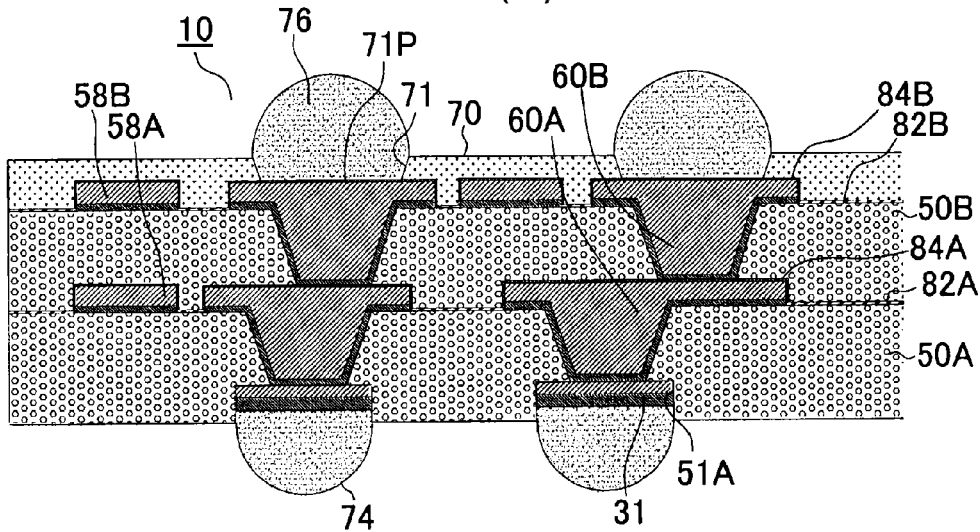
FIG. 1(C) is a partially enlarged view of FIG. 1(A)

FIG. 1(A) is a cross-sectional view of a printed wiring board according to a first embodiment, FIG. 1(B) is a cross-sectional view showing an applied example where an IC chip is mounted on the printed wiring board in FIG. 1(A), and FIG. 1(C) is a partially enlarged view of FIG. 1(A).

As shown in FIG. 1(C), printed wiring board 10 has first resin insulation layer (50A) and second insulation layer (50B). Recess (51A) is formed on the lower-surface side of first resin insulation layer (50A), and pad 31 is formed in the recess (51A). Solder bump 74 is formed on pad 31. The printed wiring board is structured not to have a solder-resist layer on the lower-surface side, where a solder bump is formed in recess (51A). First conductive layer (58A) is formed on the upper surface of first resin insulation layer (50A), and first conductive layer (58A) is connected to pad 31 by via conductor (60A) which penetrates through first resin insulation layer (50A). First conductive layer (58A) includes the via land of via conductor (60A). Second conductive layer (58B) is formed on the upper surface of second resin insulation layer (50B), and second conductive layer (58B) is connected to first conductive layer (58A) by via conductor (60B) which penetrates through second resin insulation layer (50B). Second conductive layer (58B) includes the via land of via conductor (60B). Second conductive layer (58B) and second resin insulation layer (50B) are covered by solder-resist layer 70, and pad portion (71P) of second conductive layer (58B) is exposed through opening 71 formed in solder-resist layer 70. Solder bump 76 is formed on pad portion (71P).

Modified resin layer (82A) is formed on the surface of first resin insulation layer (50A) by microwave-excited plasma treatment, and modified conductive layer (84A) is formed on first conductive layer (58A) by the microwave-excited plasma treatment. Because of such modified resin layer (82A) and modified conductive layer (84A), first resin insulation layer (50A) and first conductive layer (58A) exhibit enhanced adhesiveness to second resin insulation layer (50B) positioned as their upper layer. Modified resin layer (82B) is formed on the surface of second resin insulation layer (50B), and modified conductive layer (84B) is formed on second conductive layer (58B). Because of such modified resin layer (82B) and modified conductive layer (84B), second resin insulation layer (50B) and second conductive layer (58B) exhibit enhanced adhesiveness to solder-resist layer 70 positioned as their upper layer.

First resin insulation layer (50A) and second resin insulation layer (50B) are formed mainly containing epoxy resin, phenolic resin, polyimide resin, polyphenylene resin, polyolefin resin or fluororesin, whereas modified resin layers (82A, 82B) are made of C≡N, C—NH$_2$ and —COOH. First conductive layer (58A) and second conductive layer (58B) are formed by copper plating, whereas modified conductive layers (84A, 84B) are made of C≡N+C—NH$_2$. The thicknesses of modified resin layers (82A, 82B) are each 1~3 nm, and the thicknesses of modified conductive layers (84A, 84B) are each 1~10 nm. Solder-resist layer 70 contains carboxylic acid.

To form modified resin layers (82A, 82B) and modified conductive layers (84A, 84B), microwave-excited plasma treatment is conducted in a mixed atmosphere of nitrogen gas and hydrogen gas. Modified conductive layers (84A, 84B) on first and second conductive layers (58A, 58B) may be formed on roughened surfaces of conductive layers (58A, 58B). Alternatively, it is an option to form modified conductive layers (84A, 84B) without providing roughened surfaces on first and second conductive layers (58A, 58B).

Here, when modified conductive layers (84A, 84B) are formed without roughened surfaces provided underneath, second resin insulation layer (50B) positioned as the upper layer of first conductive layer (58A) does not show undulations caused by a roughened surface. Accordingly, second conductive layer (58B) on resin insulation layer (50B) is set to have a fine pitch.

In a printed wiring board of the first embodiment, modified resin layer (82A) and modified conductive layer (84A) are respectively formed by microwave-excited plasma treatment on first resin insulation layer (50A) and first conductive layer (58A) formed on the resin insulation layer, and modified resin layer (82B) and modified conductive layer (84B) are respectively formed by microwave-excited plasma treatment on second resin insulation layer (50B) and second conductive layer (58B) formed on the resin insulation layer. Accordingly, because of modified resin layer (82A) and modified conductive layer (84A), first resin insulation layer (50A) and first conductive layer (58A) exhibit enhanced adhesiveness to the second resin insulation layer (50B) positioned above. Also, because of modified resin layer (82B) and modified conductive layer (84B), second resin insulation layer (50B) and second conductive layer (58B) exhibit enhanced adhesiveness to their upper solder-resist layer 70. As a result, such modified layers eliminate the need to form a roughened surface with concaves shaped therein, which is formed by adding soluble particles to a resin insulation layer and by dissolving the particles for the purpose of maintaining adhesiveness between resin insulation layers. Namely, since first and second conductive layers (58A, 58B) are formed on highly smooth surfaces of first and second resin insulation layers (50A, 50B) respectively, conductive layers (58A, 58B) are set to have a fine pitch.

Modified resin layer (82A) on first resin insulation layer (50A) includes C≡N, C—NH$_2$ and —COOH. In such a case, since C—N polar groups are introduced to a surface of the resin insulation layer, the adhesiveness to its upper second resin insulation layer (50B) is enhanced. Modified resin layer (82B) on second resin insulation layer (50B) also includes C≡N, C—NH$_2$ and —COOH. In such a case, C≡NH$^+$ and C—NH$_2$$^+$ on the second resin insulation layer (50B) side form hydrogen bonding with COO$^-$ of carboxylic acid on the solder-resist layer 70 side. Accordingly, adhesiveness is enhanced between the second resin layer and the solder-resist layer.

Manufacturing Method in First Embodiment

A method for manufacturing a printed wiring board according to the first embodiment is described below with reference to FIG. 2~5.

Figure 2A:
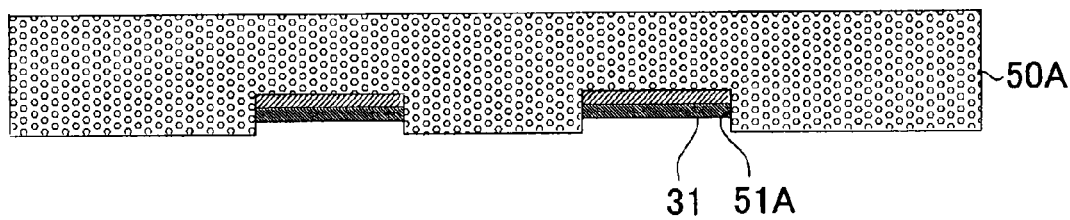
FIG. 2(A)-2(D) are views showing manufacturing steps of a printed wiring board of the first embodiment.

(1) First resin insulation layer (50A) is prepared where recess (51A) is formed on the lower surface side and pad 31 is formed in recess (51A) as shown in FIG. 2(A). The lower-surface side of first resin insulation layer (50A) is held by a support plate (not shown), and a printed wiring board will be separated from the support plate upon completion of the printed wiring board. First resin insulation layer (50A) having pad 31 is manufactured using a method described in JP 2012-191204A, for example. The entire contents of this publication are incorporated herein by reference.

First resin insulation layer (50A) is made of epoxy resin and contains inorganic filler or the like. Alternatively, the first resin insulation layer may be a film-type resin insulation layer containing glass cloth obtained by impregnating a glass-fiber cloth with epoxy resin and by thermosetting the resin. However, the material for each resin insulation layer is not limited to those, and any other material may also be used.

Figure 2B:
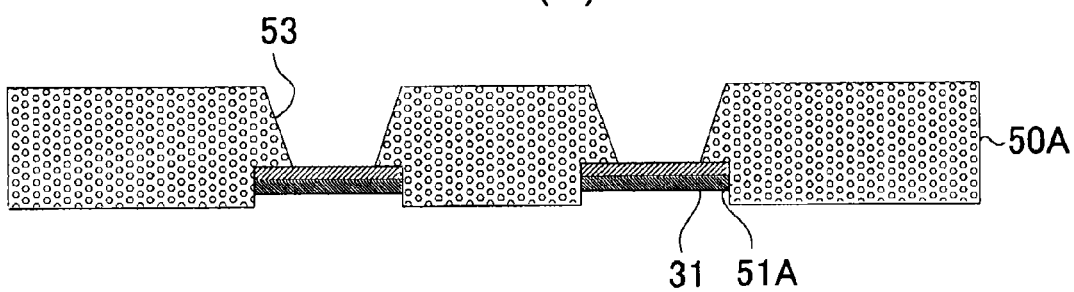
Figure 2C:
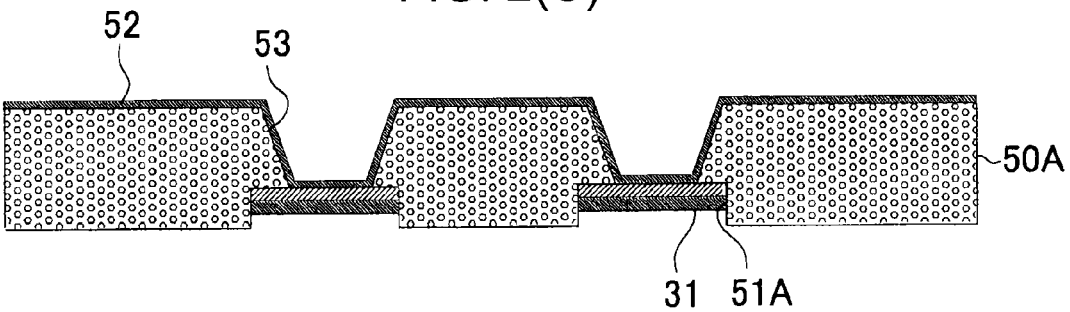

(2) In first resin insulation layer (50A), opening 53 is formed to reach pad 31 by using a laser (FIG. 2(B)). Here, opening 53 is a via opening in which to form a via conductor.

Figure 4A:
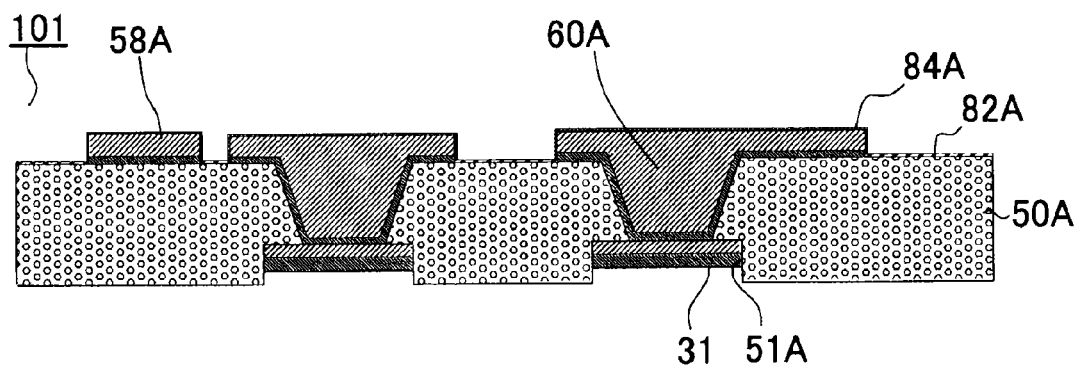
FIG. 4(A)-4(C) are views showing manufacturing steps of a printed wiring board of the first embodiment.
Figure 4B:
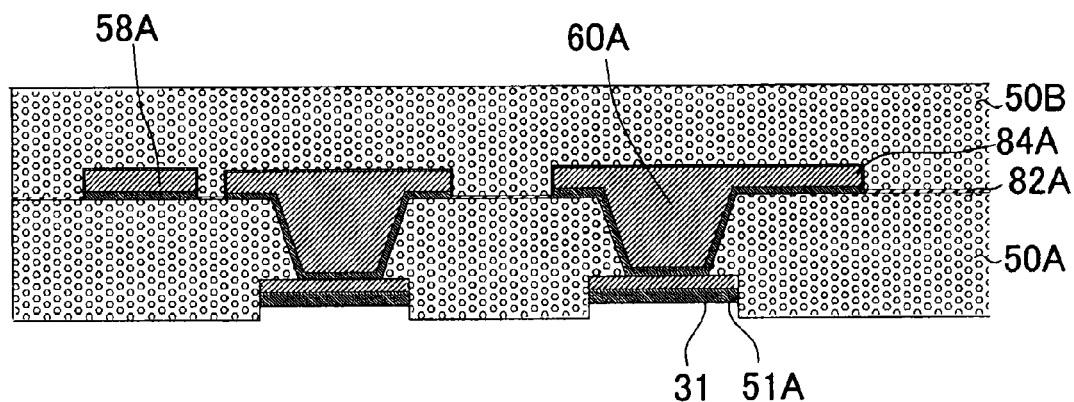
Figure 4C:
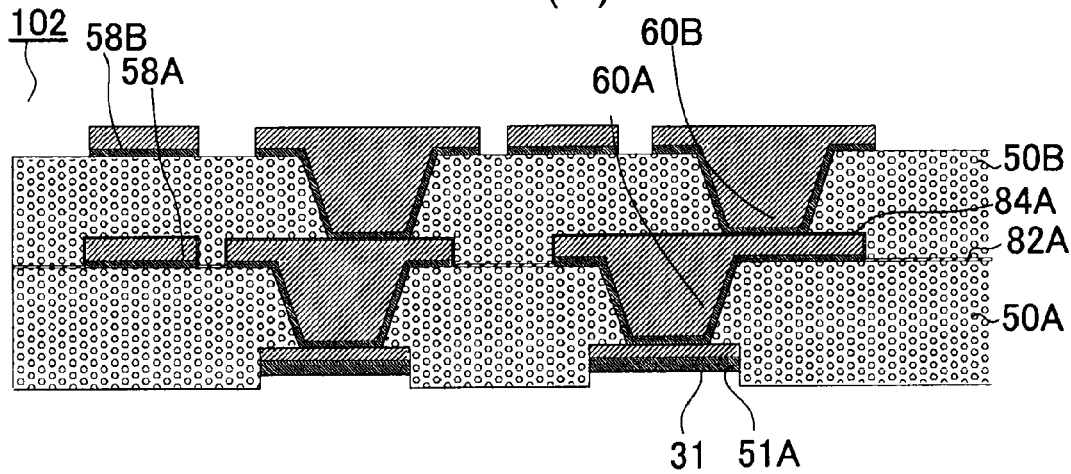

(3) By performing electroless copper plating, 1 μm-thick copper seed layer 52 is formed on the surface of first resin insulation layer (50A) and in opening 53 (FIG. 4(C)).

Figure 2D:
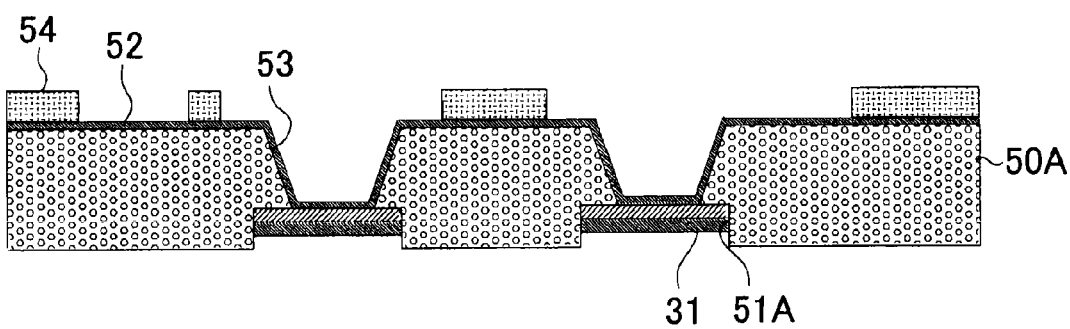

(4) Copper-plating resist 54 with a predetermined pattern is formed on copper seed layer 52 (FIG. 2(D)).

Figure 3A:
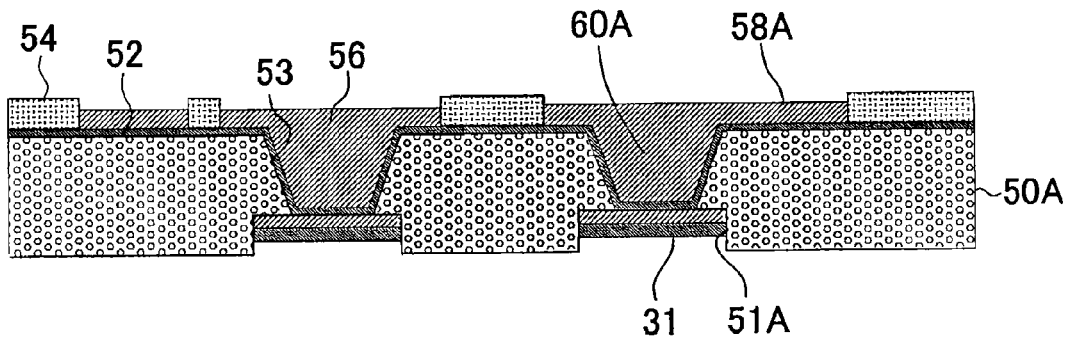
FIG. 3(A)-3(C) are views showing manufacturing steps of a printed wiring board of the first embodiment.

(5) By performing electrolytic copper plating, electrolytic copper-plated film 56 is formed where no copper plating resist is formed (FIG. 3(A)). At that time, via conductor (60A) is formed by filling electrolytic copper-plated film in the inner side of copper seed layer 52 formed on the inner wall of opening 53, and first conductive layer (58A) made up of copper seed layer 52 and electrolytic copper-plated film 56 is formed on the upper-surface side. The thickness of first conductive layer (58A) is 15 μm~20 μm.

Figure 3B:
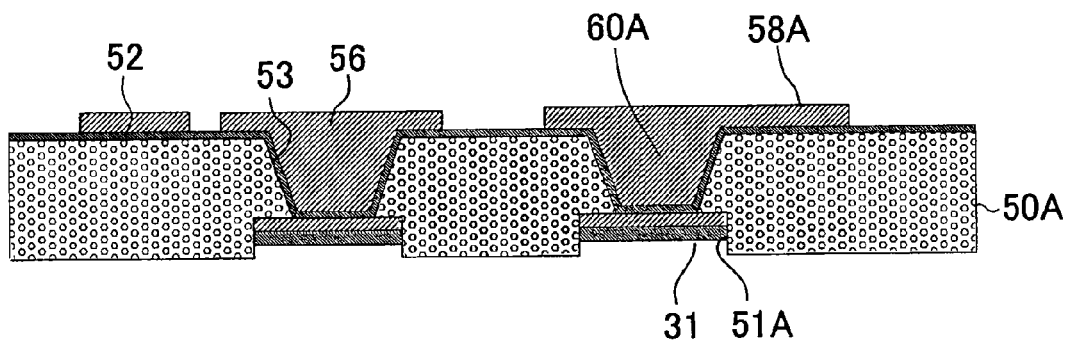
Figure 3C:
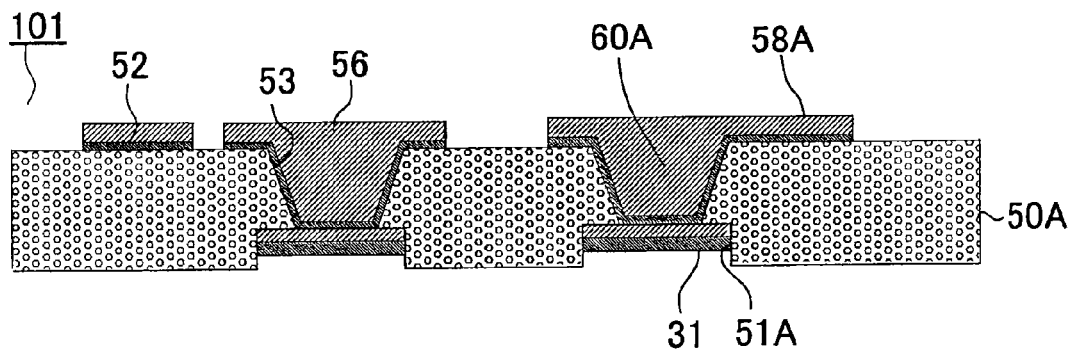

(6) The copper plating resist is removed (FIG. 3(B)). Copper seed layer 52 is removed from where no electrolytic copper-plated film 56 is formed. Accordingly, first intermediate body 101 is completed, having first conductive layer (58A) formed on first resin insulation layer (50A) (FIG. 3(C)).

(7) On first intermediate body 101, a microwave-excited plasma treatment is conducted. Modified conductive layer (84A) made of Cu$_3$N+Cu(NH)x is formed on the surface of first conductive layer (58A), and modified resin layer (82A) including C≡N, C—NH$_2$ and —COOH is formed on the surface of first resin insulation layer (50A) (FIG. 4(A)). The thickness of modified resin layer (82A) is 1~3 nm, and the thickness of modified conductive layer (84A) is 1~10 nm. Such a microwave-excited plasma treatment is conducted by accommodating the first intermediate body in a vacuum chamber of a microwave-excited plasma treatment apparatus. A mixed atmosphere of nitrogen gas and hydrogen gas is set in the vacuum chamber. Since microwave-excited plasma treatment is an isotropic treatment, when a modified layer is formed on the surface of first conductive layer (58A), the modified layer of substantially the same thickness is also formed on side surfaces of first conductive layer (58A).

The number of radicals generated in a microwave-excited plasma treatment is significantly high, and thus high reactivity is observed. Namely, since the frequency is high and newly generated electrons are constantly accelerated, the plasma density is high. In addition, since the distance is long from where the plasma is generated to the substrate (first intermediate body 101), ions and electrons in the plasma are bonded again and disappear, leaving behind radicals, which are highly effective for chemical modifications or ashing. Also, since microwave-excited plasma treatment is capable of carrying out chemical modifications at low temperature, damage to the substrate (first intermediate body 101) is low. Namely, since plasma passes through a dielectric body and is introduced into the vacuum chamber, the energy is absorbed in the dielectric body and microwaves are prevented from coming into the vacuum chamber. As a result, the plasma on the substrate has low electron energy, and the temperature of the substrate is kept from rising.

A microwave-excited plasma treatment is conducted under the following conditions: concentration of the hydrogen gas in a mixed atmosphere of nitrogen gas and hydrogen gas at a volume ratio of 0.1~5%; pressure of 25~100 Pa; flow rate of 300~1200 sccm for $N_2$ gas and 10~50 sccm for $H_2$ gas; microwave frequency of 2.56 GHz; input electricity of 3 kW; treatment time of 20~60 seconds; and treatment temperature of 150° C. or lower but 30° C. or higher.

FIG. 6 is a view schematically showing surface modifications of a resin insulation layer and a conductive layer through a microwave-excited plasma treatment. On a resin insulation layer made of resin and a conductive layer made of copper shown in FIG. 6(A), $N_2+H_2$ plasma is exerted. As a result, because of a large number of NH* radicals, $Cu_3N$+Cu (NH)x is generated on the conductive layer surface, while C≡N, C—$NH_2$ and —COOH are generated on the resin surface, introducing functional groups to the surfaces (FIG. 6(B)). Through such functional groups, adhesiveness is improved between the lower resin insulation layer (first resin insulation layer (50A)) and upper resin insulation layer (second resin insulation layer (50B)) (FIG. 6(C)).

(8) On first conductive layer (58A) with modified conductive layer (84A) and on first resin insulation layer (50A) with modified resin layer (82A), second resin insulation layer (50B) is formed using the same material as that of the first resin insulation layer (FIG. 4(B)). As described above, adhesiveness is enhanced between first resin insulation layer (50A) and second resin insulation layer (50B) because of the functional groups (modified resin layer (82A), modified conductive layer (84A)).

(9) By employing the same steps as in FIG. 2(B)~FIG. 3(C), second intermediate body 102 is completed, where second conductive layer (58B) is formed on second resin insulation layer (50B) having via conductor (60B) (FIG. 4(C)).

The same microwave-excited plasma treatment as that shown in FIG. 4(A) is conducted on second intermediate body 102. Accordingly, modified conductive layer (84B) made of $Cu_3N$+Cu(NH)x is formed on the surface of second conductive layer (58B), and modified resin layer (82B) made of C≡N, C—$NH_2$ and —COOH is formed on the surface of second resin insulation layer (50B) (FIG. 5(A)). The thickness of modified resin layer (82B) is 1~3 nm, and the thickness of modified conductive layer (84B) is 1~10 nm.

Figure 6A:
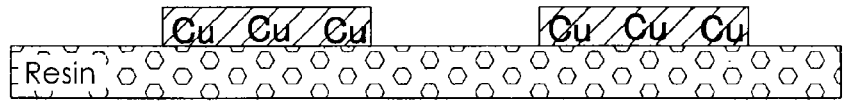
Figure 6A:
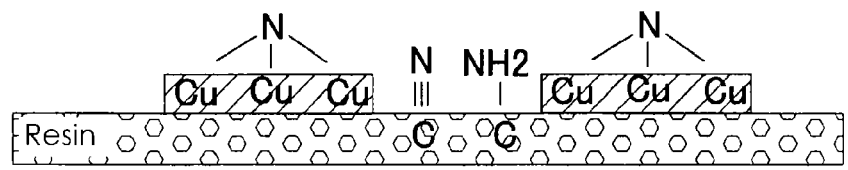
Figure 6C:
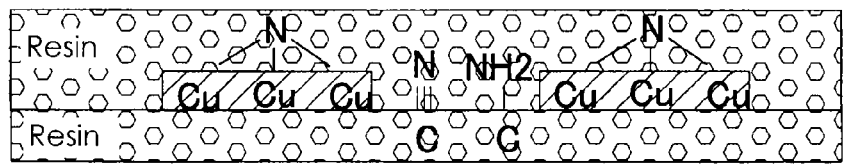
Figure 6D:
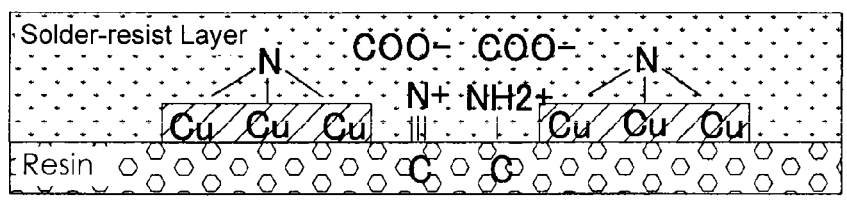

As described above with reference to FIG. 6, on a resin insulation layer made of resin and a conductive layer made of copper shown in FIG. 6(A), $N_2+H_2$ plasma is exerted. As a result, because of a large number of NH* radicals, $Cu_3N$+ Cu(NH)x is generated on the conductive layer surface, while C≡N, C—$NH_2$ and —COOH are generated on the resin surface, introducing functional groups to the surfaces (FIG. 6(B)). The functional groups form hydrogen bonding with carboxylic acid (COO⁻) in the solder-resist layer, thus enhancing adhesiveness between the resin insulation layer (second resin insulation layer (50(B)) and the solder-resist layer (solder-resist layer 70) (FIG. 6(D)).

Figure 5A:
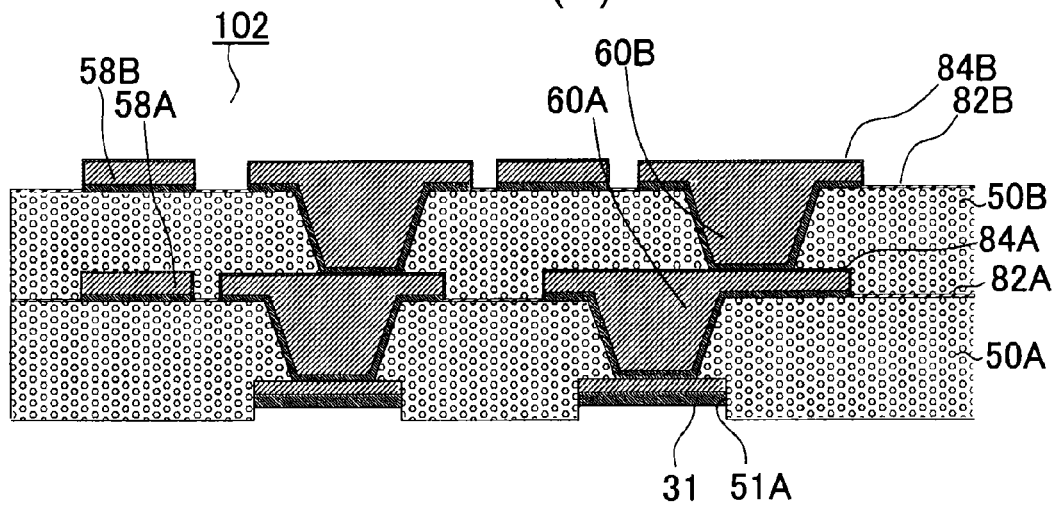
FIG. 5(A)-5(C) are views showing manufacturing steps of a printed wiring board of the first embodiment.
Figure 5B:
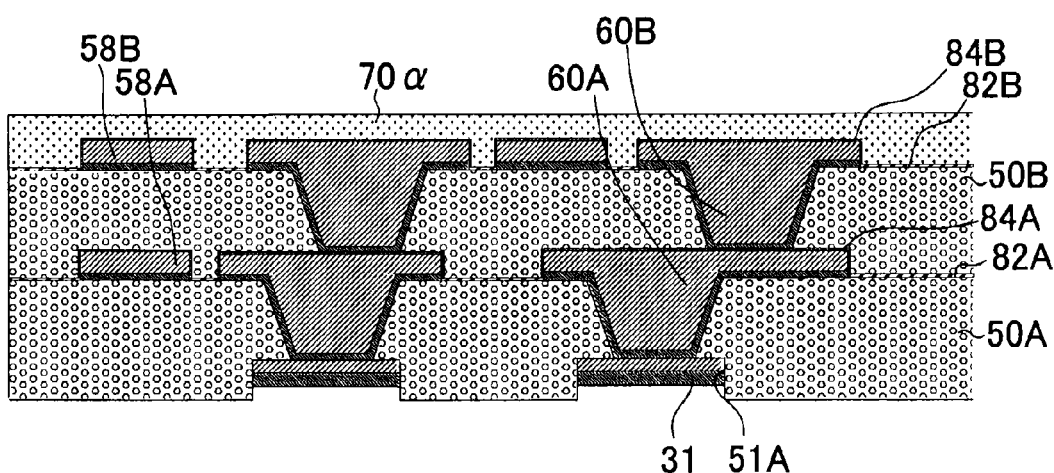
Figure 5C:
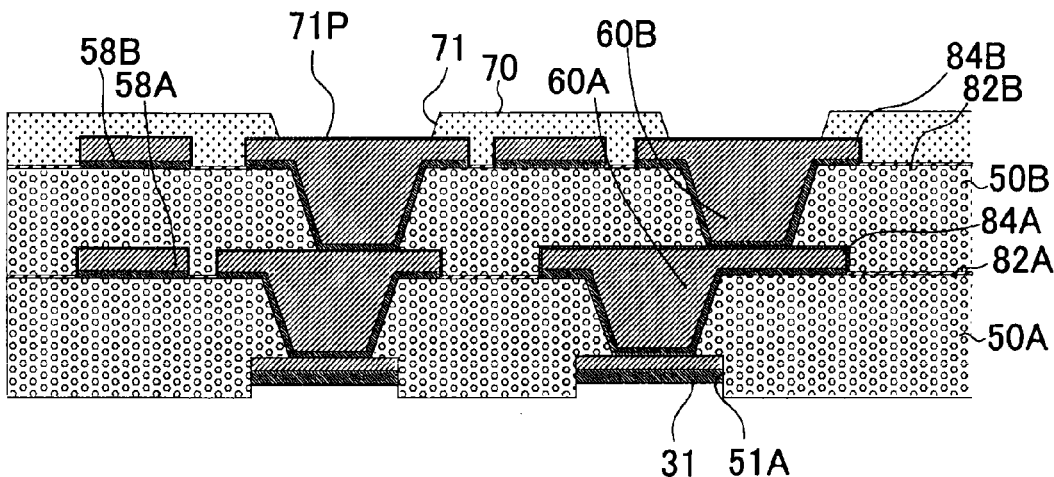

(11) On second conductive layer (58B) with modified conductive layer (84B) and on second resin insulation layer (50B) with modified resin layer (82B), solder-resist composition (70α) is applied (FIG. 5(B)), and is then exposed to light and developed, subsequently forming solder-resist layer 70 with opening 71 to expose pad portion (71P) of the second conductive layer (FIG. 5(C)). As described above, the functional groups form hydrogen bonding with carboxylic acid (COO⁻) in the solder-resist layer, enhancing adhesiveness between the resin insulation layer (second resin insulation layer (50B)) and the solder-resist layer (solder-resist layer 70). Here, the aforementioned support plate (not shown) is separated from the printed wiring board. OSP film or metal film such as Ni/Au film, Ni/Pd/Au film or Sn film may be formed on pad portion (71P) and pad 31.

(12) Solder balls are loaded on pad portion (71P) and pad 31, and a reflow is conducted to form solder bumps (76, 74). Accordingly, printed wiring board 10 is completed (FIG. 1(A)).

Pad 92 of an IC chip is connected through solder bump 76 of the printed wiring board. Accordingly, IC chip 90 is mounted on the printed wiring board (FIG. 1(B)).

In a method for manufacturing a printed wiring board according to the first embodiment, a microwave-excited plasma treatment is conducted on a resin insulation layer and on a conductive layer in a mixed atmosphere of nitrogen gas and hydrogen gas so as to form a modified resin layer on the resin insulation layer and a modified conductive layer on the conductive layer. For example, C≡N, C—$NH_2$ and —COOH are formed as modified resin layers (82A, 82B) respectively on first and second resin insulation layers (50A, 50B), whereas C≡N+C—$NH_2$ is formed as modified conductive layers (84A, 84B) respectively on first and second conductive layers (58A, 58B). Such modified resin layers and modified conductive layers improve adhesiveness to the upper resin insulation layer or solder-resist layer. Thus, first and second conductive layers (58A, 58B) are formed on highly smooth surfaces of first and second resin insulation layers (50A, 50B) respectively, allowing the first and second conductive layers to be formed at a fine pitch. In addition, since a first conductive layer does not have a roughened surface to improve its adhesiveness to second resin insulation layer (50B), an undulated surface caused by a roughened surface is prevented from occurring in upper second resin insulation layer (50B). Accordingly, second conductive layer (58B) on the second resin insulation layer is set to have a fine pitch.

In the above embodiment, a coreless buildup printed wiring board is shown. However, the present invention may also be applied to a buildup printed wiring board with a core substrate.

When the line width in a conductive layer is reduced to achieve a finer conductive pattern, a resin insulation layer is required to have a higher level of smoothness. However, when a roughened surface with concaves shaped therein is formed by dissolving soluble particles, it is difficult to reduce the line width in a conductive layer beyond a certain narrowness.

A printed wiring board according to an embodiment of the present invention and a method for manufacturing a printed wiring board according to an embodiment of the present invention have a resin insulation layer and a conductive layer which exhibit excellent adhesiveness to their upper layer.

A printed wiring board according to an embodiment of the present invention has a resin insulation layer, a conductive layer formed on a surface of the resin insulation layer, and a via conductor which penetrates through the resin insulation layer and connects the conductive layer formed on each of both surfaces of the resin insulation layer. The printed wiring board is formed by alternately laminating a conductive layer and a resin insulation layer. In addition, a surface modified layer is formed through plasma treatment on the resin insulation layer and on the conductive layer formed on the resin insulation layer. The modified layer on the resin insulation layer is a different type from that formed on the conductive layer.

A method for manufacturing a printed wiring board according to an embodiment of the present invention includes forming a conductive layer on a resin insulation layer; and forming different types of modified layers respectively on the resin insulation layer and the conductive layer by microwave-excited plasma treatment conducted on the resin insulation layer and on the conductive layer in a mixed atmosphere of nitrogen gas and hydrogen gas.

In a printed wiring board according to an embodiment of the present invention, since modified layers obtained through plasma treatment are formed respectively on a resin insulation layer and a conductive layer on the resin insulation layer, adhesiveness to their upper resin insulation layer or solder-resist layer is improved by such modified layers. Therefore, to maintain adhesiveness between resin insulation layers, a resin insulation layer that contains soluble particles is not used and a roughened surface with concaves shaped is not formed therein by dissolving such particles. Namely, since a conductive layer is formed on a resin insulation layer having a highly smooth surface, the conductive layer is set to have a fine pitch. In addition, a conductive layer does not have a roughened surface to improve its adhesiveness to the upper resin insulation layer. Accordingly, the upper resin insulation layer is prevented from having an undulated surface caused by a roughened surface, and a fine-pitch conductive layer is formed on the upper resin insulation layer.

For example, when the modified layer on a resin insulation layer includes $C{\equiv}N$, $C-NH_2$ and $-COOH$, $C-N$ polar groups are introduced to a surface of the resin insulation layer, and the adhesiveness to the upper resin insulation layer is improved. Also, when a solder-resist layer is laminated on a resin insulation layer, $C{\equiv}NH^+$ and $C-NH_2^+$ on the resin insulation layer side form hydrogen bonding with $COO^-$ of carboxylic acid on the solder-resist layer side. Accordingly, adhesiveness is enhanced.

In a method for manufacturing a printed wiring board according to an embodiment of the present invention, a microwave-excited plasma treatment is conducted on a resin insulation layer and on a conductive layer in a mixed atmosphere of nitrogen gas and hydrogen gas to form modified layers on the resin insulation layer and the conductive layer respectively. For example, $C{\equiv}N$, $C-NH_2$ and $-COOH$ are formed as a modified layer on the resin insulation layer, and $C{\equiv}N+C-NH_2$ is formed as a modified layer on the conductive layer. Adhesiveness to the upper resin insulation layer or solder-resist layer is improved through such modified layers. As a result, a conductive layer is formed on a resin insulation layer having a highly smooth surface, resulting in a fine-pitch conductive layer. In addition, when a conductive layer does not have a roughened surface to improve its adhesiveness to the upper resin insulation layer, undulations caused by a roughened surface are prevented from occurring in the upper resin insulation layer. Accordingly, the conductive layer on the resin insulation layer is set to have a fine pitch.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a plurality of resin insulation layers;
    a plurality of conductive layers formed on the resin insulation layers respectively such that each of the conductive layers is formed on a surface of each of the resin insulation layers; and
    a plurality of via conductors penetrating through the resin insulation layers respectively such that the plurality of via conductors is connecting the plurality of conductive layers through the resin insulation layers,
    wherein each of the resin insulation layers includes a modified resin layer formed by plasma treatment such that the modified resin layer is forming the surface of each of the resin insulation layers, each of the conductive layers includes a modified conductive layer formed by the plasma treatment such that the modified conductive layer is forming the surface of each of the conductive layers, the modified resin layer has a surface modification different from a surface modification of the modified conductive layer, the plurality of resin insulation layers has a main component comprising a resin selected from the group consisting of an epoxy resin, a phenolic resin, a polyimide resin, a polyphenylene resin, a polyolefin resin and a fluororesin, the modified resin layer of each of the resin insulation layers has $C{\equiv}N$, $C-NH_2$ and $-COOH$, the plurality of conductive layers comprises copper plating, and the modified conductive layer of each of the conductive layers has $Cu_3N+Cu(NH)x$.

2. A printed wiring board according to claim 1, wherein the modified conductive layer of each of the conductive layers has a thickness which is in a range of from 1 nm to 10 nm.

3. A printed wiring board according to claim 2, wherein the plasma treatment is applied in a mixed gas atmosphere comprising a nitrogen gas and a hydrogen gas.

4. A printed wiring board according to claim 3, further comprising:
    a solder resist layer formed on an outermost conductive layer of the plurality of conductive layers and an outermost resin insulation layer of the plurality of resin insulation layers.

5. A printed wiring board according to claim 2, wherein each of the conductive layers has a roughened layer such that the modified conductive layer of each of the conductive layers is formed on the roughened layer of each of the conductive layers.

6. A printed wiring board according to claim 5, wherein the plasma treatment is applied in a mixed gas atmosphere comprising a nitrogen gas and a hydrogen gas.

7. A printed wiring board according to claim 6, further comprising:

a solder resist layer formed on an outermost conductive layer of the plurality of conductive layers and an outermost resin insulation layer of the plurality of resin insulation layers.

8. A printed wiring board according to claim 2, further comprising:
a solder resist layer formed on an outermost conductive layer of the plurality of conductive layers and an outermost resin insulation layer of the plurality of resin insulation layers.

9. A printed wiring board according to claim 8, wherein each of the conductive layers has a roughened layer such that the modified conductive layer of each of the conductive layers is formed on the roughened layer of each of the conductive layers.

10. A printed wiring board according to claim 2, wherein the plurality of resin insulation layers has the main component comprising the epoxy resin.

11. A printed wiring board according to claim 1, wherein the plasma treatment is applied in a mixed gas atmosphere comprising a nitrogen gas and a hydrogen gas.

12. A printed wiring board according to claim 11, wherein each of the conductive layers has a roughened layer such that the modified conductive layer of each of the conductive layers is formed on the roughened layer of each of the conductive layers.

13. A printed wiring board according to claim 12, further comprising:
a solder resist layer formed on an outermost conductive layer of the plurality of conductive layers and an outermost resin insulation layer of the plurality of resin insulation layers.

14. A printed wiring board according to claim 11, further comprising:
a solder resist layer formed on an outermost conductive layer of the plurality of conductive layers and an outermost resin insulation layer of the plurality of resin insulation layers.

15. A printed wiring board according to claim 11, wherein the plurality of resin insulation layers has the main component comprising the epoxy resin.

16. A printed wiring board according to claim 1, wherein each of the conductive layers has a roughened layer such that the modified conductive layer of each of the conductive layers is formed on the roughened layer of each of the conductive layers.

17. A printed wiring board according to claim 16, further comprising:
a solder resist layer formed on an outermost conductive layer of the plurality of conductive layers and an outermost resin insulation layer of the plurality of resin insulation layers.

18. A printed wiring board according to claim 16, wherein the plurality of resin insulation layers has the main component comprising the epoxy resin.

19. A printed wiring board according to claim 1, further comprising:
a solder resist layer formed on an outermost conductive layer of the plurality of conductive layers and an outermost resin insulation layer of the plurality of resin insulation layers.

20. A printed wiring board according to claim 1, wherein the plurality of resin insulation layers has the main component comprising the epoxy resin.

* * * * *